United States Patent
Deguchi

(10) Patent No.: US 11,316,486 B2
(45) Date of Patent: Apr. 26, 2022

(54) HIGH FREQUENCY CIRCUIT AND COMMUNICATION DEVICE

(71) Applicant: Murata Manufacturing Co., Ltd., Kyoto (JP)

(72) Inventor: Kazuaki Deguchi, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 120 days.

(21) Appl. No.: 16/858,013

(22) Filed: Apr. 24, 2020

(65) Prior Publication Data
US 2020/0343866 A1  Oct. 29, 2020

(30) Foreign Application Priority Data
Apr. 26, 2019 (JP) .............................. JP2019-085021

(51) Int. Cl.
| | |
|---|---|
| *H03F 3/191* | (2006.01) |
| *H03F 3/24* | (2006.01) |
| *H03F 3/195* | (2006.01) |
| *H03F 3/21* | (2006.01) |
| *H03F 1/56* | (2006.01) |
| *H04B 1/04* | (2006.01) |

(52) U.S. Cl.
CPC ............. *H03F 3/245* (2013.01); *H03F 1/565* (2013.01); *H03F 3/195* (2013.01); *H03F 3/211* (2013.01); *H04B 1/0458* (2013.01); *H03F 2200/267* (2013.01); *H03F 2200/294* (2013.01); *H03F 2200/318* (2013.01); *H03F 2200/421* (2013.01); *H03F 2200/451* (2013.01)

(58) Field of Classification Search
CPC ............. H03F 3/191; H03F 3/193; H03F 1/56
USPC .................................................. 330/302, 305
See application file for complete search history.

(56) References Cited

U.S. PATENT DOCUMENTS

| | | | | |
|---|---|---|---|---|
| 4,545,258 | A | * 10/1985 | Coursolle | ................ H03G 9/14 |
| | | | | 330/149 |
| 10,038,414 | B2 | * 7/2018 | Ranta | ....................... H03F 3/213 |
| 2003/0032396 | A1 | 2/2003 | Tsuchiya et al. | |
| 2008/0278260 | A1 | 11/2008 | Fukuda et al. | |

FOREIGN PATENT DOCUMENTS

| | | |
|---|---|---|
| CN | 101304244 A | 11/2008 |
| JP | H10-224157 A | 8/1998 |
| JP | 2003-51751 A | 2/2003 |
| JP | 2013-38560 A | 2/2013 |

* cited by examiner

*Primary Examiner* — Steven J Mottola
(74) *Attorney, Agent, or Firm* — Pearne & Gordon LLP

(57) ABSTRACT

A high frequency circuit includes a transmit terminal and a transmit and receive terminal, a power amplifier that amplifies a high frequency signal inputted from the transmit terminal and outputs the high frequency signal toward the transmit and receive terminal, and an output matching circuit that is positioned on a signal path connecting the power amplifier and the transmit and receive terminal and that optimizes the output load impedance of the power amplifier. The output matching circuit includes a matching circuit coupled to an output terminal of the power amplifier, another matching circuit, and a switch that changes a connection between the matching circuits. The power amplifier and the switch are formed at a single semiconductor IC. The matching circuits are formed outside the semiconductor IC.

20 Claims, 7 Drawing Sheets

HIGH FREQUENCY CIRCUIT AND COMMUNICATION DEVICE

This application claims priority from Japanese Patent Application No. 2019-085021 filed on Apr. 26, 2019. The content of this application is incorporated herein by reference in its entirety.

BACKGROUND

The present disclosure relates to a high frequency circuit and a communication device including the high frequency circuit.

Japanese Unexamined Patent Application Publication No. 10-224157 discloses a high frequency amplifier circuit including a high frequency amplifier and an output matching circuit that adjusts the output impedance of the high frequency amplifier. By using the output matching circuit, it is possible to amplify high frequency signals in a particular frequency band with a low loss.

BRIEF SUMMARY

However, in the case of recent mobile communication devices supporting multiple modes/multiple bands, for example, when different communication modes are used, impedance matching may have to be established to achieve different optimum values of output load impedance of a high frequency amplifier with respect to two kinds of high frequency signals in adjacent or overlapping different frequency bands. In such a case, when the circuit constant of a passive element, such as an inductor or a capacitor constituting an output matching circuit is fixed, it is impossible to highly accurately establish impedance matching for both the two kinds of high frequency signals described above. As a result, the output matching circuit needs switching means, such as a switch in addition to the passive element described above, and thus, the size of a high frequency amplifier circuit is increased.

The present disclosure provides a small high frequency circuit and a small communication device that can highly accurately establish impedance matching with respect to two kinds of high frequency signals in adjacent or overlapping different frequency bands.

A high frequency circuit according to an aspect of the present disclosure includes a first terminal and a second terminal, a first amplifier that amplifies a high frequency signal inputted from the first terminal and outputs the high frequency signal toward the second terminal, and an output matching circuit that is positioned on a signal path connecting the first amplifier and the second terminal and that optimizes output load impedance of the first amplifier. The output matching circuit includes a first common matching circuit that is coupled to an output terminal of the first amplifier and that has a first passive element, a selective matching circuit that has a second passive element, and a first switching circuit that switches between a connected state and a disconnected state of the first common matching circuit and the selective matching circuit. The first amplifier and the first switching circuit are formed at a single semiconductor integrated circuit. The first passive element and the second passive element are formed outside the semiconductor integrated circuit.

The present disclosure can provide a small high frequency circuit and a small communication device that can highly accurately establish impedance matching with respect to two kinds of high frequency signals in adjacent or overlapping different frequency bands.

Other features, elements, characteristics and advantages of the present disclosure will become more apparent from the following detailed description of embodiments of the present disclosure with reference to the attached drawings.

DETAILED DESCRIPTION

Figure 1:
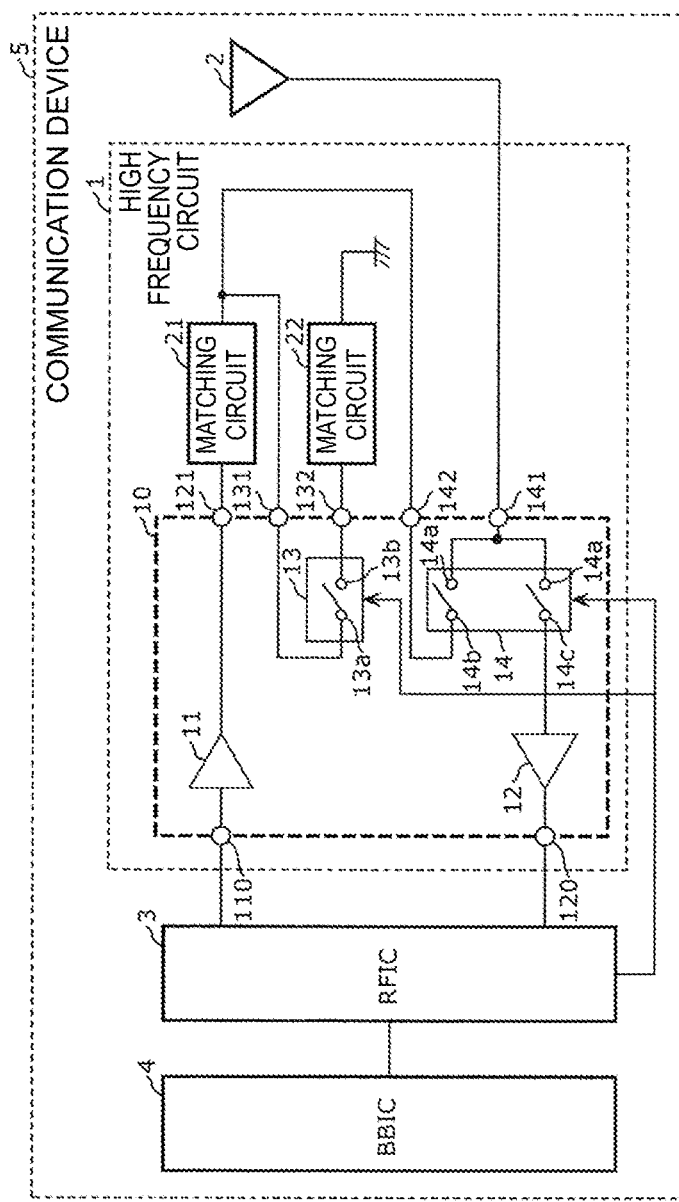
FIG. 1 is a circuit block diagram of a high frequency circuit and a communication device according to a first embodiment.

Hereinafter, embodiments of the present disclosure will be described in detail with reference to the drawings. It should be noted that the embodiments described below are all specific or comprehensive instances. The numerical values, the shapes, the materials, the constituent elements, the arrangements of the constituent elements, and the modes of connection, and the like given in the following embodiments are mere instances and are not intended to limit the present disclosure. Among the constituent elements in the following embodiments, constituent elements not recited in any of the independent claims are described as arbitrary constituent elements. Furthermore, the size of each of the constituent element illustrated in the drawings or the ratio of the sizes are not necessarily illustrated in an exact manner.

First Embodiment 1.1 Circuit configuration of high frequency circuit 1 and communication device 5

FIG. 1 is a circuit block diagram of a high frequency circuit 1 and a communication device 5 according to a first embodiment. As illustrated in the drawing, the communication device 5 includes the high frequency circuit 1, an antenna 2, an RF signal processing circuit (RFIC) 3, and a baseband signal processing circuit (BBIC) 4. The high frequency circuit 1 is positioned at, for example, a front-end of a multimode/multiband mobile phone.

The RFIC 3 is an RF signal processing circuit that processes a high frequency signal received or to be transmitted by the antenna 2. Specifically, the RFIC 3 processes a transmit signal inputted from the BBIC 4 by upconversion or the like and outputs a high-frequency transmit signal generated by the signal processing to the high frequency circuit 1. In contrast, the RFIC 3 processes a high frequency signal inputted from the high frequency circuit 1 by downconversion or the like and outputs a receive signal generated by the signal processing to the BBIC 4. The RFIC 3 includes a controller that outputs a control signal for controlling connection switching between switches 13 and 14 included in the high frequency circuit 1 to the switches 13 and 14.

The BBIC 4 performs signal processing by using an intermediate frequency band lower than high frequency signals propagate the high frequency circuit 1. The signal processed by the BBIC 4 is used as, for example, an image signal for displaying an image or a sound signal for calls through a speaker.

The antenna 2 is coupled to a transmit and receive terminal 141 of the high frequency circuit 1. The antenna 2 radiates a high frequency signal inputted from the high frequency circuit 1 and receives a high frequency signal from outside and outputs the high frequency signal to the high frequency circuit 1.

Next, details of the configuration of the high frequency circuit 1 is described.

The high frequency circuit 1 includes a power amplifier 11, a low-noise amplifier 12, the switches 13 and 14, the transmit and receive terminal 141, a transmit terminal 110, a receive terminal 120, terminals 121, 131, 132, and 142, and matching circuits 21 and 22.

The transmit terminal 110 is an example of a first terminal and is coupled to the RFIC 3. The transmit and receive terminal 141 is an example of a second terminal and is coupled to the antenna 2. The receive terminal 120 is an example of a third terminal and is coupled to the RFIC 3.

The power amplifier 11 is an example of a first amplifier and amplifies a high frequency signal inputted from the transmit terminal 110 and outputs the high frequency signal toward the transmit and receive terminal 141. Specifically, an input terminal of the power amplifier 11 is coupled to the transmit terminal 110 and an output terminal of the power amplifier 11 is coupled to the terminal 121.

The low-noise amplifier 12 is an example of a second amplifier and amplifies a high frequency signal inputted from the transmit and receive terminal 141 and outputs the high frequency signal to the receive terminal 120. Specifically, an input terminal of the low-noise amplifier 12 is coupled to the switch 14 and an output terminal of the low-noise amplifier 12 is coupled to the receive terminal 120.

The switch 13 is an example of a first switching circuit and includes terminals 13a and 13b. The terminal 13a is coupled to the terminal 131 and the terminal 13b is coupled to the terminal 132.

The switch 14 is an example of a third switching circuit and includes a common terminal 14a, and selection terminals 14b and 14c. The common terminal 14a is coupled to the transmit and receive terminal 141, the selection terminal 14b is coupled to the terminal 142, and the selection terminal 14c is coupled to an input terminal of the low-noise amplifier 12.

The matching circuit 21 is an example of a first common matching circuit and includes a first passive element. The first passive element is, for example, at least either an inductor or a capacitor. One end of the matching circuit 21 is coupled to the output terminal of the power amplifier 11 via the terminal 121. The other end of the matching circuit 21 is coupled to the terminal 13a of the switch 13 via the terminal 131 and also is coupled to the selection terminal 14b of the switch 14 via the terminal 142.

The matching circuit 22 is an example of a selective matching circuit and includes a second passive element. The second passive element is, for example, at least either an inductor or a capacitor. One end of the matching circuit 22 is coupled to the terminal 13b of the switch 13 via the terminal 132. The other end of the matching circuit 22 is coupled to ground. The matching circuit 22 may be inserted into a path connecting the matching circuit 21 and the terminal 131; in this case, the terminal 132 is coupled to ground.

When the switch 13 is in a connected state due to the connection relationship of the switch 13 and the matching circuits 21 and 22, the matching circuit 22 is in communication with the matching circuit 21; when the switch 13 is in a disconnected state, the matching circuit 22 is not in communication with the matching circuit 21. This means that the switch 13 switches between a connected state and a disconnected state of the matching circuits 21 and 22.

In the case in which the common terminal 14a and the selection terminal 14b are in communication with each other due to the connection relationship of the switch 14, the low-noise amplifier 12, and the matching circuit 21, connection is established between the transmit and receive terminal 141 and the power amplifier 11 via the matching circuit 21. By contrast, in the case in which the common terminal 14a and the selection terminal 14c are in communication with each other, connection is established between the transmit and receive terminal 141 and the low-noise amplifier 12. This means that the switch 14 switches between a connected state and a disconnected state of the transmit and receive terminal 141 and the low-noise amplifier 12.

In the configuration described above, the matching circuits 21 and 22 are is coupled to a signal path connecting the power amplifier 11 and the transmit and receive terminal 141, such that the configuration described above, the matching circuits 21 and 22 forms an output matching circuit for optimizing the output load impedance of the power amplifier 11.

Among the constituent elements included in the high frequency circuit 1, the power amplifier 11, the low-noise amplifier 12, the switches 13 and 14, the transmit and receive terminal 141, the transmit terminal 110, the receive terminal 120, and the terminals 121, 131, 132, and 142 are formed at a semiconductor integrated circuit (IC) 10; in other words, the power amplifier 11, the low-noise amplifier 12, the switches 13 and 14, the transmit and receive terminal 141, the transmit terminal 110, the receive terminal 120, and the terminals 121, 131, 132, and 142 are formed at the same IC substrate as a single chip. The transmit and receive terminal 141, the transmit terminal 110, the receive terminal 120, and the terminals 121, 131, 132, and 142 may be formed outside the semiconductor IC 10.

The semiconductor IC 10 is formed by, for example, complementary metal oxide semiconductor (CMOS). Specifically, the semiconductor IC 10 is formed by a silicon on insulator (SOI) process. This enables inexpensive manufacturing the semiconductor IC 10. The semiconductor IC 10 may be formed of at least any of GaAs, SiGe, and GaN. With this configuration, it is possible to output high frequency signals of high amplification performance and low-noise performance.

The semiconductor IC 10 may also include a digital control circuit. In this case, the controller of the RFIC 3 and the switches 13 and 14 is coupled to each other via the digital control circuit by using a control wire. With this configuration, the digital control circuit supplies a digital control signal for changing connection of the switches 13 and 14 to the switches 13 and 14 via the control wire.

Among the constituent elements included in the high frequency circuit 1, the matching circuits 21 and 22 are formed outside the semiconductor IC 10. Part of the passive element constituting the matching circuit 21 and part of the passive element constituting the matching circuit 22 may be formed at the semiconductor IC 10; at least the first passive element constituting the matching circuit 21 and the second passive element constituting the matching circuit 22 need to be formed outside the semiconductor IC 10.

In the configuration described above, both the matching circuits 21 and 22 are added to a transmit path from the transmit terminal 110 to the terminal 142 by changing the switch 13 to a connected state on the transmit path; only the matching circuit 21 out of the matching circuits 21 and 22 is added to the transmit path by changing the switch 13 to a disconnected state. This means that only performing switching of the single switch 13 enables setting two kinds of optimum values of output load impedance of the power amplifier 11 (impedance as a terminal 142 side is viewed from the output terminal of the power amplifier 11). Furthermore, since the power amplifier 11, the low-noise amplifier 12, and the switches 13 and 14 are formed into a single chip of the semiconductor IC 10, the high frequency circuit 1 can be downsized. Since the first passive element of the matching circuit 21 and the second passive element of the matching circuit 22, which greatly affect the output load impedance value of the power amplifier 11, are positioned outside the semiconductor IC 10, it is possible to achieve high flexibility to adjust the circuit constant of the first passive element and the circuit constant of the second passive element. As a result, it is possible to provide the high frequency circuit 1 in a small size and the communication device 5 in a small size that can highly accurately establish impedance matching with respect to two kinds of high frequency signals in adjacent different frequency bands.

Moreover, since in the high frequency circuit 1 according to the present embodiment, in addition to a transmission circuit element of the power amplifier 11 and the switch 13, reception circuit elements of the low-noise amplifier 12 and the switch 14 are formed at the semiconductor IC 10, it is possible to effectively downsize the high frequency circuit having both transmission and reception functions.

It should be noted that the high frequency circuit 1 according to the present embodiment may have only the transmission function out of the functions of transmitting and receiving high frequency signals. In this case, the low-noise amplifier 12, the switch 14, the receive terminal 120, and the transmit and receive terminal 141 are unnecessary and the terminal 142 is coupled to the antenna 2 instead of the transmit and receive terminal 141.

1.2 Impedance Matching to Handle Transmission in Different Communication Modes

The high frequency circuit 1 and the communication device 5 according to the present embodiment can transmit high frequency signals in different communication modes with a low loss. Here, the communication mode includes, for example, a communication standard and an application.

Specifically, in the high frequency circuit 1 according to the present embodiment, in the case in which a high frequency signal of a first communication mode is transmitted from the transmit and receive terminal 141, the switch 13 connects the matching circuits 21 and 22. By contrast, in the case in which a high frequency signal in a second communication mode is transmitted from the transmit and receive terminal 141, the switch 13 disconnects the matching circuits 21 and 22.

Here, for example, Wi-Fi (registered trademark) is used as the first communication mode and Bluetooth (registered trademark) is used as the second communication mode. Among a plurality of frequency bands used in Wi-Fi, a relatively low frequency band is the 2.4 GHz band; the frequency band used in Bluetooth is also the 2.4 GHz band. This means that the frequency bands used in Wi-Fi and Bluetooth are almost identical to each other.

For power amplifiers widely used in high frequency circuits for wireless communication, required specifications changes in accordance with applied communication modes. Among the applied communication modes, Wi-Fi and Bluetooth use an almost identical frequency band as described above, and thus, the high frequency circuit is configured to include a single power amplifier used in common.

Here, an value of output load impedance of an optimum power amplifier with respect to adjacent channel power (hereinafter referred to as ACP), which is a main performance parameter of Bluetooth is different from an output load impedance value of an optimum power amplifier with respect to error vector magnitude (hereinafter referred to as EVM), which is a main performance parameter of Wi-Fi. Specifically, an optimum value of output load impedance of a power amplifier for improving ACP performance of Bluetooth is higher than an optimum value of output load impedance of a power amplifier for improving EVM performance of Wi-Fi.

As a result, when the circuit constant of the passive element, such as an inductor and a capacitor constituting an output matching circuit positioned at a subsequent stage after a power amplifier are fixed, it is impossible to highly accurately perform adjustment of different output load impedance values with respect to two kinds of high frequency signals in the almost identical frequency bands described above. Here, in order to make the output matching circuit changeable, if, in addition to the passive element described above, switching means, such as a switch is also added, the size of the high frequency circuit is increased. Furthermore, in order to achieve downsizing, if the power amplifier, the passive element, and the switch are formed into a single chip, since the passive element can only achieve relatively low integration density, forming such a single chip enlarges the area of the chip. Moreover, if the passive element is integrated into the chip, since the circuit constant of the passive element is fixed and it is thus impossible to perform characteristic tuning for the output matching circuit, and as a result, it is difficult to highly accurately adjust output load impedance.

Figure 2A:
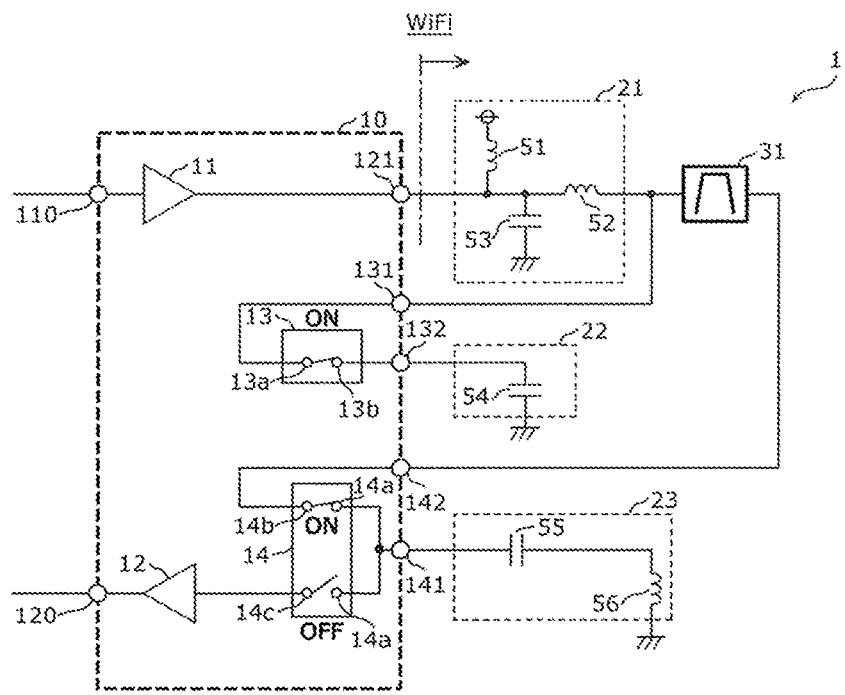
FIG. 2A is a circuit diagram in the case in which a transmit signal of Wi-Fi (registered trademark) is transmitted in the high frequency circuit according to the first embodiment.
Figure 3A:
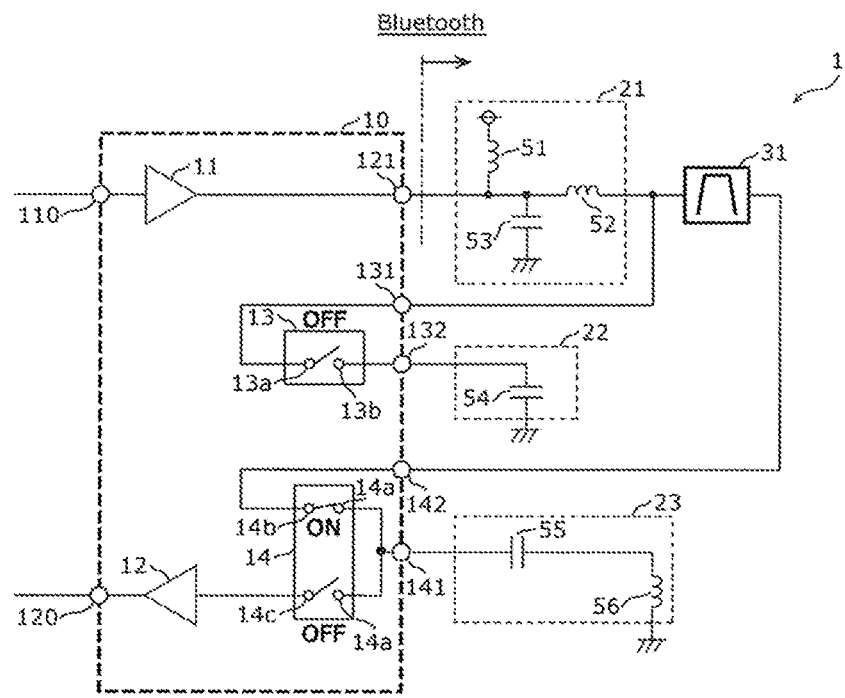
FIG. 3A is a circuit diagram in the case in which a transmit signal of Bluetooth (registered trademark) is transmitted in the high frequency circuit according to the first embodiment.

FIG. 2A is a circuit diagram in the case in which a transmit signal of Wi-Fi is transmitted in the high frequency circuit 1 according to the first embodiment. FIG. 3A is a circuit diagram in the case in which a transmit signal of Bluetooth is transmitted in the high frequency circuit 1 according to the first embodiment. The high frequency circuits 1 illustrated in FIGS. 2A and 3A indicate exemplary detailed circuit configurations of the matching circuits 21 and 22. In comparison to the high frequency circuit 1 illustrated in FIG. 1, a filter 31 and a matching circuit 23 are additionally included in the high frequency circuits 1 illustrated in FIGS. 2A and 3A. This means that the high frequency circuit 1 according to the present embodiment may include the filter 31 and the matching circuit 23 in addition to the semiconductor IC 10, and the matching circuits 21 and 22.

The filter 31 is positioned between the matching circuit 21 and the transmit and receive terminal 141 and the pass band of the filter 31 is, for example, a frequency band used in Wi-Fi and Bluetooth.

The matching circuit 23 is an example of a second common matching circuit and coupled between the transmit and receive terminal 141 and the antenna 2.

The matching circuit 21 includes inductors 51 and 52 and a capacitor 53. The inductor 51 is coupled between a node on a transmit path connecting the terminal 121 and the filter 31 and a power supply. The capacitor 53 is coupled between a node on the transmit path and ground. The inductor 52 is positioned in series on the transmit path.

The matching circuit 22 includes a capacitor 54. The capacitor 54 is coupled between the terminal 132 and ground.

The matching circuit 23 includes a capacitor 55 and an inductor 56. The capacitor 55 and the inductor 56 are coupled in series with each other between the transmit and receive terminal 141 and the antenna 2.

In the circuit configuration described above, in the case in which the high frequency circuit 1 is in a Wi-Fi mode, as illustrated in FIG. 2A, the switch 13 is changed to a connected state (ON) and the common terminal 14a and the selection terminal 14b of the switch 14 are changed to a connected state (ON). As a result, the matching circuits 21 and 22 are added to a transmit path connecting the power amplifier 11 and the transmit and receive terminal 141.

Figure 2B:
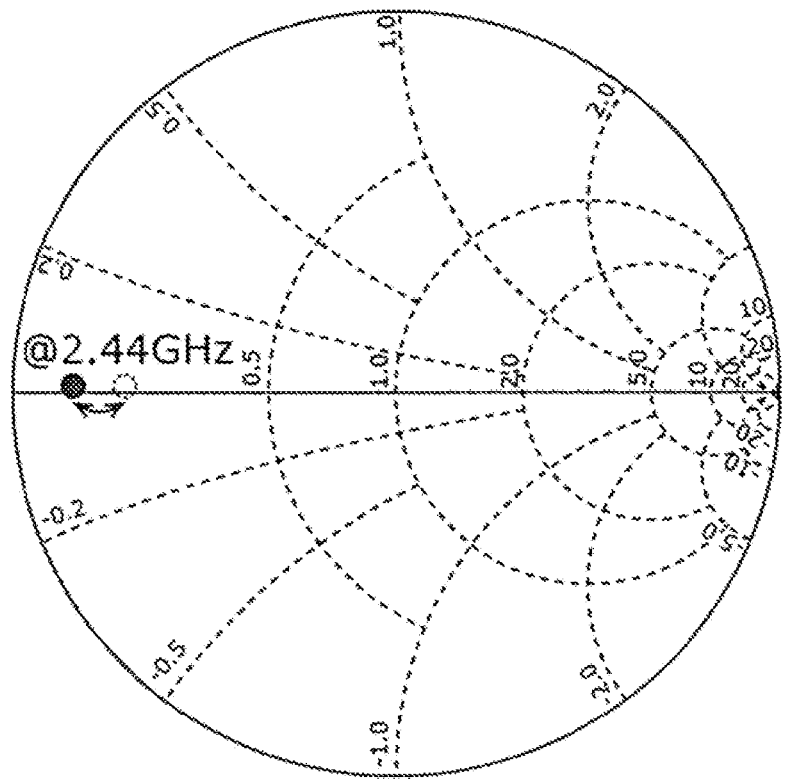
FIG. 2B is a Smith chart illustrating the output load impedance of a power amplifier in the case in which a transmit signal of Wi-Fi is transmitted in the high frequency circuit according to the first embodiment.

FIG. 2B is a Smith chart illustrating the output load impedance of the power amplifier 11 in the case in which a transmit signal of Wi-Fi is transmitted in the high frequency circuit 1 according to the first embodiment. As illustrated in the drawing, the output load impedance of the power amplifier 11 at an almost center frequency (2.44 GHz) in the frequency band used in Wi-Fi (the impedance at 2.44 GHz when a transmit and receive terminal 141 side is viewed from the terminal 121, a black circle in FIG. 2B) is located almost on a real axis on a low impedance side.

In the case in which the high frequency circuit 1 is in a Bluetooth mode, as illustrated in FIG. 3A, the switch 13 is changed to a disconnected state (OFF) and the common terminal 14a and the selection terminal 14b of the switch 14 are changed to a connected state (ON). As a result, only the matching circuit 21 out of the matching circuits 21 and 22 is added to the transmit path connecting the power amplifier 11 and the transmit and receive terminal 141.

Figure 3B:
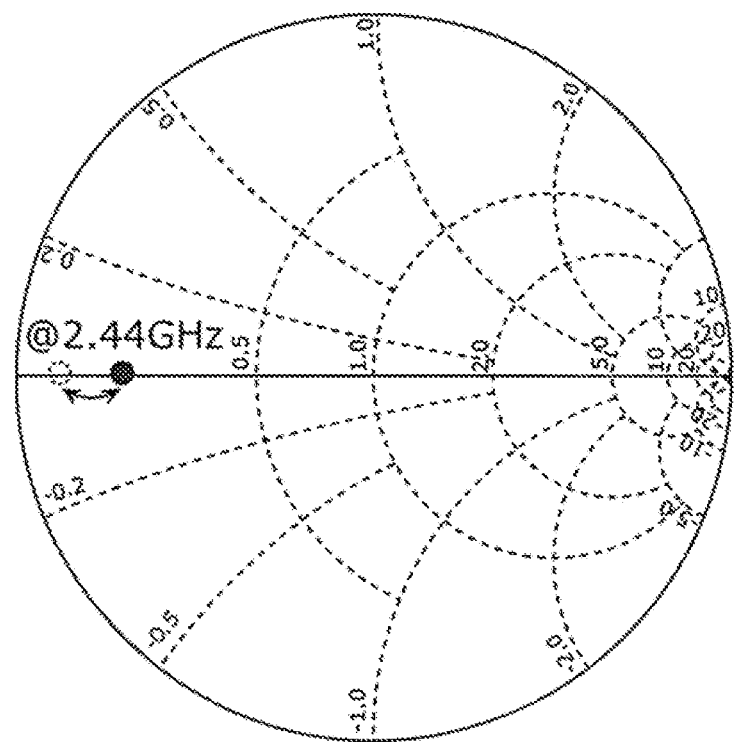
FIG. 3B is a Smith chart illustrating the output load impedance of the power amplifier in the case in which a transmit signal of Bluetooth is transmitted in the high frequency circuit according to the first embodiment.

FIG. 3B is a Smith chart illustrating the output load impedance of the power amplifier 11 in the case in which a transmit signal of Bluetooth is transmitted in the high frequency circuit 1 according to the first embodiment. As illustrated in the drawing, the output load impedance of the power amplifier 11 at an almost center frequency (2.44 GHz) in the frequency band used in Bluetooth (the impedance at 2.44 GHz when a transmit and receive terminal 141 side is viewed from the terminal 121, a black circle in FIG. 3B) is located almost on a real axis and shifted to a higher impedance side than the output load impedance of the power amplifier 11 in the Wi-Fi mode.

In the Bluetooth mode, since the switch 13 is in a disconnected state (OFF), the capacitor 54 positioned outside the semiconductor IC 10 does not affect the output load impedance of the power amplifier 11. The output load impedance of the power amplifier 11 in the Bluetooth mode is adjusted by using only the matching circuit 21 out of the matching circuits 21 and 22. Bu contrast, in the Wi-Fi mode, the switch 13 is in a connected state (ON) and the capacitor 54 is in connection with the transmit path. As a result, the output load impedance of the power amplifier 11 in the Wi-Fi mode is adjusted by using both the matching circuits 21 and 22 and moved to lower impedance side in comparison to the case of the Bluetooth mode.

With the circuit configuration described above, by performing switching of the single switch 13, the output load impedance of the power amplifier 11 can be set at an optimum value in the Wi-Fi mode and an optimum value in the Bluetooth mode. Furthermore, since the power amplifier 11, the low-noise amplifier 12, and the switches 13 and 14 are formed into a single chip of the semiconductor IC 10, the high frequency circuit 1 can be downsized. Moreover, since the passive elements (the inductors 51 and 52 and the capacitor 53) of the matching circuit 21 and the passive element (the capacitor 54) of the matching circuit 22, which greatly affect the output load impedance value of the power amplifier 11, are positioned outside the semiconductor IC 10, these passive elements can be, for example, replaced with other kinds of elements in accordance with a communication mode to which the high frequency circuit 1 is applied and high flexibility to adjust the circuit constant can be thus achieved. As a result, it is possible to provide the high frequency circuit 1 in a small size and the communication device 5 in a small size that can highly accurately establish impedance matching with respect to two kinds of communication modes, such as Wi-Fi and Bluetooth in adjacent different frequency bands.

A specific circuit configuration of the matching circuit 21 and a specific circuit configuration of the matching circuit 22 are not limited to the circuit configuration described above. For example, replacing the capacitor 54 of the matching circuit 22 with an inductor enables reversing high and low of the output load impedance of the power amplifier 11. In this case, by changing the switch 13 to a disconnected state (OFF), the output load impedance of the power amplifier 11 is located almost on the real axis on a low impedance side; by changing the switch 13 to a connected state (ON), the output load impedance of the power amplifier 11 is located on a relatively high impedance side. Thus, in this case, the switch 13 is changed to a connected state (ON) in the Bluetooth mode and the switch 13 is changed to a disconnected state (OFF) in the Wi-Fi mode. This means that Bluetooth may be used as the first communication mode and Wi-Fi may be used as the second communication mode.

1.3 Effects

As described above, in the present embodiment, the high frequency circuit 1 includes the transmit terminal 110 and the transmit and receive terminal 141, the power amplifier 11 that amplifies a high frequency signal inputted from the transmit terminal 110 and outputs the high frequency signal toward the transmit and receive terminal 141, and the output matching circuit that is positioned on the signal path connecting the power amplifier 11 and the transmit and receive terminal 141 and that optimizes the output load impedance of the power amplifier 11. The output matching circuit includes the matching circuit 21 that is coupled to the output terminal of the power amplifier 11 and has the first passive element, the matching circuit 22 that has the second passive element, and the switch 13 that switches between a connected state and a disconnected state of the matching circuits 21 and 22. The power amplifier 11 and the switch 13 are formed at the single semiconductor IC 10. The first passive element and the second passive element are formed outside the semiconductor IC 10.

With this configuration, it is possible to provide the high frequency circuit 1 in a small size that can highly accurately establish impedance matching by changing the optimum value of the output load impedance of the power amplifier 11 with respect to two kinds of high frequency signals in adjacent or overlapping different frequency bands.

Furthermore, in the present embodiment, in the case in which a high frequency signal of the first communication mode is transmitted from the transmit and receive terminal 141, the switch 13 may connect the matching circuits 21 and 22; in the case in which a high frequency signal of the second communication mode is transmitted from the transmit and receive terminal 141, the switch 13 may disconnect the matching circuits 21 and 22.

With this configuration, performing switching of the single switch 13 enables setting two kinds of optimum values of output load impedance of the power amplifier 11. As a result, it is possible to provide the high frequency circuit 1 in a small size.

Moreover, in the present embodiment, the first communication mode may be Wi-Fi and the second communication mode may be Bluetooth.

With this configuration, in response to switching between the Bluetooth mode, an important performance parameter of which is ACP, and the Wi-Fi mode, an important performance parameter of which is EVM, it is possible to change the output load impedance value of the power amplifier 11.

Further, in the present embodiment, the high frequency circuit 1 further includes the receive terminal 120, the low-noise amplifier 12 that is coupled to the receive terminal 120 and that amplifies a high frequency signal inputted from the transmit and receive terminal 141 and outputs the high frequency signal to the receive terminal 120, and the switch 14 that switches between a connected state and a disconnected state of the transmit and receive terminal 141 and the low-noise amplifier 12. The low-noise amplifier 12 and the switch 14 may be formed at the semiconductor IC 10.

With this configuration, switching between transmission and reception can be performed together with optimum impedance adjustment.

Furthermore, in the present embodiment, the high frequency circuit 1 may further include the filter 31 positioned between the matching circuit 21 and the transmit and receive terminal 141.

With this configuration, it is possible to reduce noise in a high frequency signal outputted from the power amplifier 11 and the filter 31 can be used as an impedance matching circuit provided between the power amplifier 11 and the transmit and receive terminal 141.

Moreover, in the present embodiment, the communication device 5 includes the RFIC 3 that processes a high frequency signal received or to be transmitted by the antenna 2 and the high frequency circuit 1 that communicates the high frequency signal between the antenna 2 and the RFIC 3.

With this configuration, it is possible to provide the communication device 5 in a small size that can highly accurately establish impedance matching by changing the optimum value of the output load impedance of the power amplifier 11 with respect to two kinds of high frequency signals in adjacent or overlapping different frequency bands.

Second Embodiment

A high frequency circuit 1A according to the present embodiment differs from the high frequency circuit 1 according to the first embodiment in a connection configuration of the first common matching circuit, the selective matching circuit, and a switching circuit.

Figure 4:
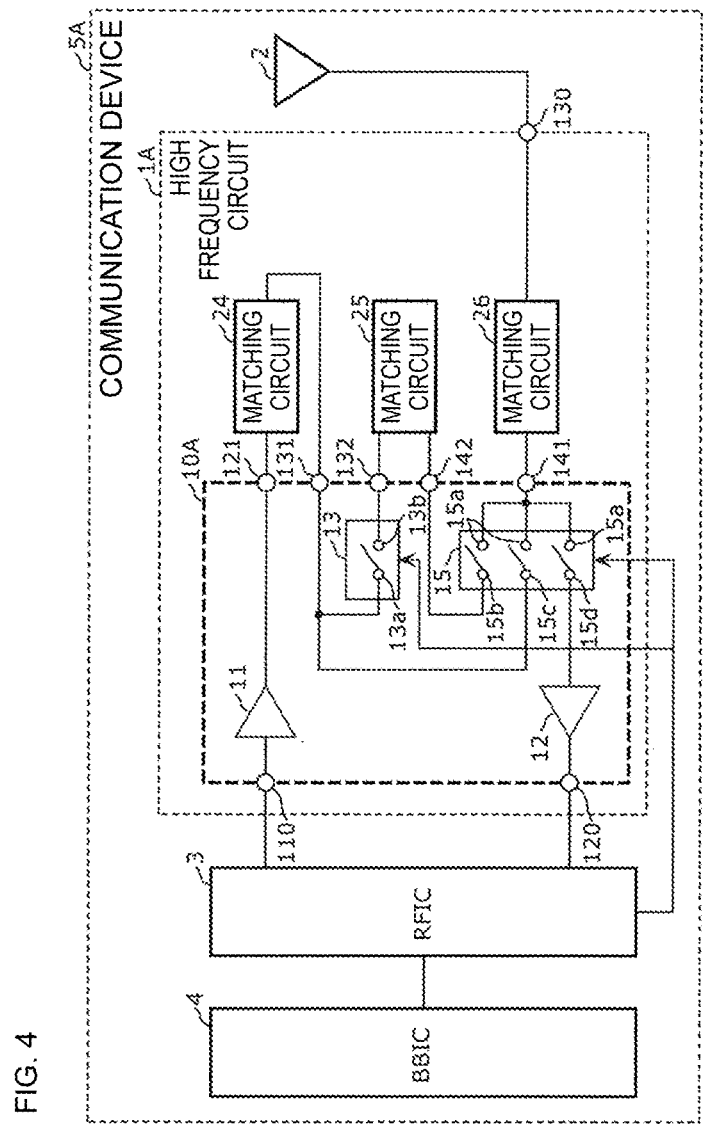
FIG. 4 is a circuit block diagram of a high frequency circuit and a communication device according to a second embodiment.

2.1 Circuit Configuration of High Frequency Circuit 1A and Communication Device 5A FIG. 4 is a circuit block diagram of the high frequency circuit 1A and a communication device 5A according to a second embodiment. As illustrated in the drawing, the communication device 5A includes the high frequency circuit 1A, the antenna 2, the RFIC 3, and the BBIC 4. The high frequency circuit 1A is positioned at, for example, a front-end of a multimode/multiband mobile phone. The communication device 5A according to the present embodiment differs from the communication device 5 according to the first embodiment in a circuit configuration of the high frequency circuit 1A. Hereinafter, the communication device 5A according to the present embodiment is described while the description mainly focuses on the configuration of the high frequency circuit 1A.

The high frequency circuit 1A includes the power amplifier 11, the low-noise amplifier 12, the switch 13 and a switch 15, the transmit and receive terminal 141, the transmit terminal 110, the receive terminal 120, an external connection terminal 130, the terminals 121, 131, 132, and 142, and matching circuits 24, 25, and 26. The high frequency circuit 1A according to the present embodiment differs from the high frequency circuit 1 according to the first embodiment in configurations of the switch 15, and the matching circuits 24, 25, and 26. Hereinafter, concerning the high frequency circuit 1A according to the present embodiment, description of configurations identical to the configurations of the high frequency circuit 1 according to the first embodiment is omitted and different configurations are mainly described.

The low-noise amplifier 12 is an example of the second amplifier and amplifies a high frequency signal inputted from the transmit and receive terminal 141 and outputs the high frequency signal to the receive terminal 120. Specifically, the input terminal of the low-noise amplifier 12 is coupled to the switch 15 and the output terminal of the low-noise amplifier 12 is coupled to the receive terminal 120.

The switch 15 is an example of the fourth switching circuit and includes a common terminal 15a, a selection terminal 15b (a second selection terminal), a selection terminal 15c (a first selection terminal), and a selection terminal 15d (a third selection terminal). The switch 15 changes a connection between the common terminal 15a and the selection terminal 15b, a connection between the common terminal 15a and the selection terminal 15c, and a connection between the common terminal 15a and the selection terminal 15d. The switch 15 is, for example, a multiple-pole multiple-throw switching circuit. The common terminal 15a is coupled to the transmit and receive terminal 141, the selection terminal 15b is coupled to the matching circuit 25 via the terminal 142, the selection terminal 15c is coupled to the matching circuit 24 via the terminal 131, and the selection terminal 15d is coupled to the input terminal of the low-noise amplifier 12.

The matching circuit 24 is an example of a first common matching circuit and includes a first passive element. The first passive element is, for example, at least either an inductor or a capacitor. One end of the matching circuit 24 is coupled to the output terminal of the power amplifier 11 via the terminal 121. The other end of the matching circuit 24 is coupled to the terminal 13a of the switch 13 via the terminal 131 and also is coupled to the selection terminal 15c of the switch 15 via the terminal 131.

The matching circuit 25 is an example of a selective matching circuit and includes a second passive element. The second passive element is, for example, at least either an inductor or a capacitor. One end of the matching circuit 25 is coupled to the terminal 13b of the switch 13 via the terminal 132. The other end of the matching circuit 25 is coupled to the selection terminal 15b of the switch 15 via the terminal 142.

The matching circuit 26 is an example of the second common matching circuit and coupled between the transmit and receive terminal 141 and the external connection terminal 130.

In the case in which the switch 13 is in a connected state due to the connection relationship of the switches 13 and 15, and the matching circuits 24 and 25, the matching circuit 25 is in connection to the matching circuit 24. This means that the switch 13 switches between a connected state and a disconnected state of the matching circuits 24 and 25. In the case in which the common terminal 15a and the selection terminal 15b of the switch 15 are in a connected state, the matching circuit 25 is in connection to the transmit and receive terminal 141. In the case in which the common terminal 15a and the selection terminal 15c of the switch 15 are in a connected state, the matching circuit 24 is in connection to the transmit and receive terminal 141. In the case in which the common terminal 15a and the selection terminal 15d of the switch 15 are in a connected state, the low-noise amplifier 12 is in connection to the transmit and receive terminal 141. This means that the switch 15 changes a connection between the transmit and receive terminal 141 and the matching circuit 24, a connection between the transmit and receive terminal 141 and the matching circuit 25, and a connection between the low-noise amplifier 12 and the transmit and receive terminal 141.

The switch 15 may be constituted by two switching circuits (a second switching circuit and the third switching circuit). Specifically, the second switching circuit includes the common terminal 15a, and the selection terminals 15b and 15c of the switch 15 and changes a connection between the transmit and receive terminal 141 and the matching circuit 24 and a connection between the transmit and receive terminal 141 and the matching circuit 25. The third switching circuit includes the common terminal 15a and the selection terminal 15d of the switch 15 and changes a connection between the low-noise amplifier 12 and the transmit and receive terminal 141.

In the configuration described above, the matching circuits 24 and 25 are positioned on a signal path connecting the power amplifier 11 and the transmit and receive terminal 141, such that the configuration described above, the matching circuits 24 and 25 forms an output matching circuit for optimizing the output load impedance of the power amplifier 11.

Among the constituent elements included in the high frequency circuit 1A, the power amplifier 11, the low-noise amplifier 12, the switches 13 and 15, the transmit and receive terminal 141, the transmit terminal 110, the receive terminal 120, and the terminals 121, 131, 132, and 142 are formed at a semiconductor IC 10A; in other words, the power amplifier 11, the low-noise amplifier 12, the switches 13 and 15, the transmit and receive terminal 141, the transmit terminal 110, the receive terminal 120, and the terminals 121, 131, 132, and 142 are formed at the same IC substrate as a single chip. The transmit and receive terminal 141, the transmit terminal 110, the receive terminal 120, and the terminals 121, 131, 132, and 142 may be formed outside the semiconductor IC 10A.

Among the constituent elements of the high frequency circuit 1A, the matching circuits 24, 25, and 26 are formed outside the semiconductor IC 10A. Part of the passive element constituting the matching circuit 24 and part of the passive element constituting the matching circuit 25 may be formed at the semiconductor IC 10A; at least the first passive element constituting the matching circuit 24 and the second passive element constituting the matching circuit 25 need to be formed outside the semiconductor IC 10A.

In the configuration described above, the matching circuits 24 and 25 are added to a transmit path from the transmit terminal 110 to the transmit and receive terminal 141 by changing the switch 13 to a connected state and changing the common terminal 15a and the selection terminal 15b of the switch 15 to a connected state on the transmit path. Only the matching circuit 24 out of the matching circuits 24 and 25 is added to the transmit path by changing the switch 13 to a disconnected state and changing the common terminal 15a and the selection terminal 15c of the switch 15 to a connected state. This means that only performing switching of the switches 13 and 15 enables setting two kinds of optimum values of output load impedance of the power amplifier 11 (impedance as a terminal 142 side is viewed from the output terminal of the power amplifier 11). Furthermore, since the power amplifier 11, the low-noise amplifier 12, and the switches 13 and 15 are formed into a single chip of the semiconductor IC 10A, the high frequency circuit 1 can be downsized. Since the first passive element of the matching circuit 24 and the second passive element of the matching circuit 25, which greatly affect the output load impedance value of the power amplifier 11, are positioned outside the semiconductor IC 10A, it is possible to achieve high flexibility to adjust the circuit constant of the first passive element and the circuit constant of the second passive element. As a result, it is possible to provide the high frequency circuit 1A in a small size and the communication device 5A in a small size that can highly accurately establish impedance matching with respect to two kinds of high frequency signals in adjacent different frequency bands.

Moreover, since in the high frequency circuit 1A according to the present embodiment, in addition to a transmission circuit element of the power amplifier 11 and the switches 13 and 15 (the common terminal 15a, and the selection terminals 15b and 15c), reception circuit elements of the low-noise amplifier 12 and the switch 15 (the common terminal 15a and the selection terminal 15d) is formed at the semiconductor IC 10A, it is possible to effectively downsize the high frequency circuit having both transmission and reception functions.

It should be noted that the high frequency circuit 1A according to the present embodiment may have only the transmission function out of the functions of transmitting and receiving high frequency signals. In this case, the low-noise amplifier 12, the switch 15 (the common terminal 15a and the selection terminal 15d), and the receive terminal 120 are unnecessary.

2.2 Impedance Matching to Handle Transmission in Different Communication Modes

The high frequency circuit 1A and the communication device 5A according to the present embodiment can transmit high frequency signals in different communication modes with a low loss. Specifically, in the high frequency circuit 1A according to the present embodiment, in the case in which a high frequency signal of the first communication mode is transmitted from the transmit and receive terminal 141, the switch 13 connects the matching circuits 24 and 25 and the switch 15 connects the matching circuit 25 and the transmit and receive terminal 141. By contrast, in the case in which a high frequency signal of the second communication mode is transmitted from the transmit and receive terminal 141, the switch 13 disconnects the matching circuits 24 and 25 and the switch 15 connects the matching circuit 24 and the transmit and receive terminal 141.

Here, Bluetooth is used as the first communication mode and Wi-Fi is used as the second communication mode.

Figure 5A:
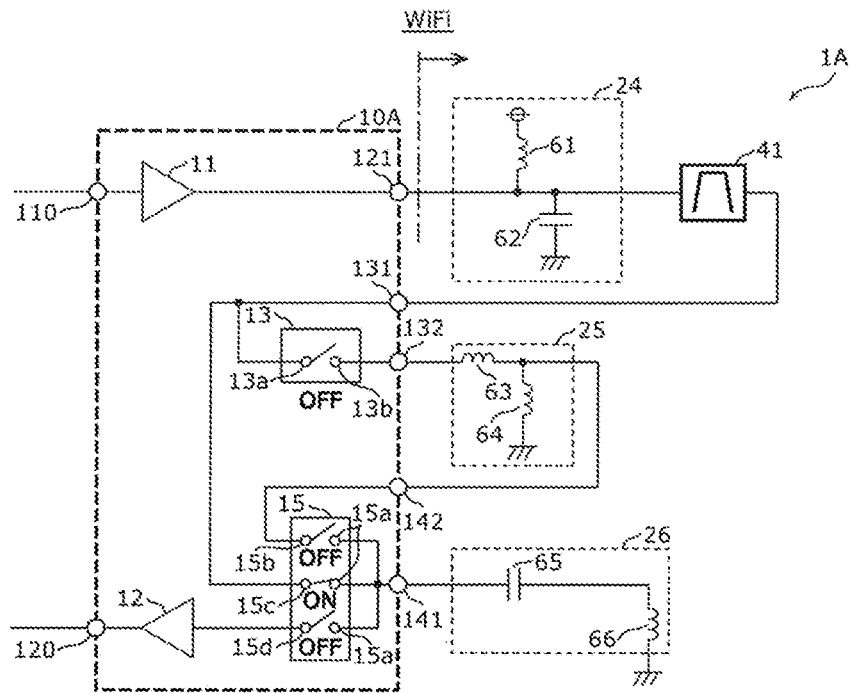
FIG. 5A is a circuit diagram in the case in which a transmit signal of Wi-Fi is transmitted in the high frequency circuit according to the second embodiment.
Figure 6A:
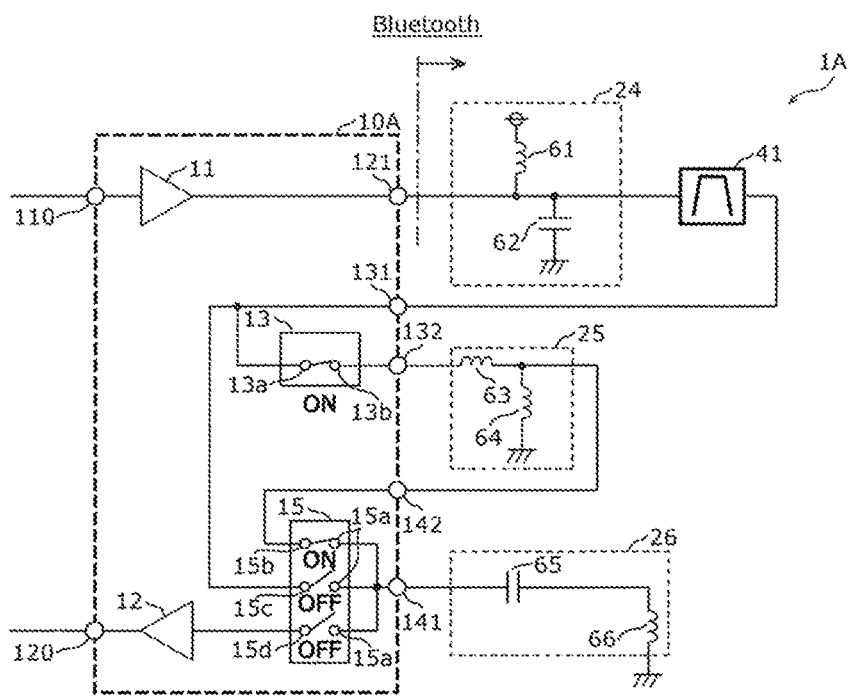
FIG. 6A is a circuit diagram in the case in which a transmit signal of Bluetooth is transmitted in the high frequency circuit according to the second embodiment.

FIG. 5A is a circuit diagram in the case in which a transmit signal of Wi-Fi is transmitted in the high frequency circuit 1A according to the second embodiment. FIG. 6A is a circuit diagram in the case in which a transmit signal of Bluetooth is transmitted in the high frequency circuit 1A according to the second embodiment. The high frequency circuits 1A illustrated in FIGS. 5A and 6A indicate exemplary detailed circuit configurations of the matching circuits 24, 25, and 26. In comparison to the high frequency circuit 1A illustrated in FIG. 4, a filter 41 is additionally included in the high frequency circuits 1A illustrated in FIGS. 5A and 6A. This means that the high frequency circuit 1A according to the present embodiment may include the filter 41 in addition to the semiconductor IC 10A, and the matching circuits 24, 25, and 26.

The filter 41 is positioned between the matching circuit 24 and the terminal 132 and the pass band of the filter 31 is, for example, a frequency band used in Wi-Fi and Bluetooth.

The matching circuit 26 is an example of the second common matching circuit and coupled between the transmit and receive terminal 141 and the external connection terminal 130.

The matching circuit 24 includes an inductor 61 and a capacitor 62. The inductor 61 is coupled between a node on a transmit path connecting the terminal 121 and the filter 41 and a power supply. The capacitor 62 is coupled between a node on the transmit path and ground.

The matching circuit 25 includes inductors 63 and 64. The inductor 63 is coupled in series on a transmit path connecting the terminals 132 and 142 and the inductor 64 is coupled between a node on the transmit path and ground.

The matching circuit 26 includes a capacitor 65 and an inductor 66. The capacitor 65 and the inductor 66 are coupled in series with each other between the transmit and receive terminal 141 and the antenna 2.

In the circuit configuration described above, in the case in which the high frequency circuit 1A is in the Wi-Fi mode, as illustrated in FIG. 5A, the switch 13 is changed to a disconnected state (OFF) and the common terminal 15a and the selection terminal 15c of the switch 15 are changed to a connected state (ON). As a result, only the matching circuit 24 out of the matching circuits 24 and 25 is added to the transmit path connecting the power amplifier 11 and the transmit and receive terminal 141.

Figure 5B:
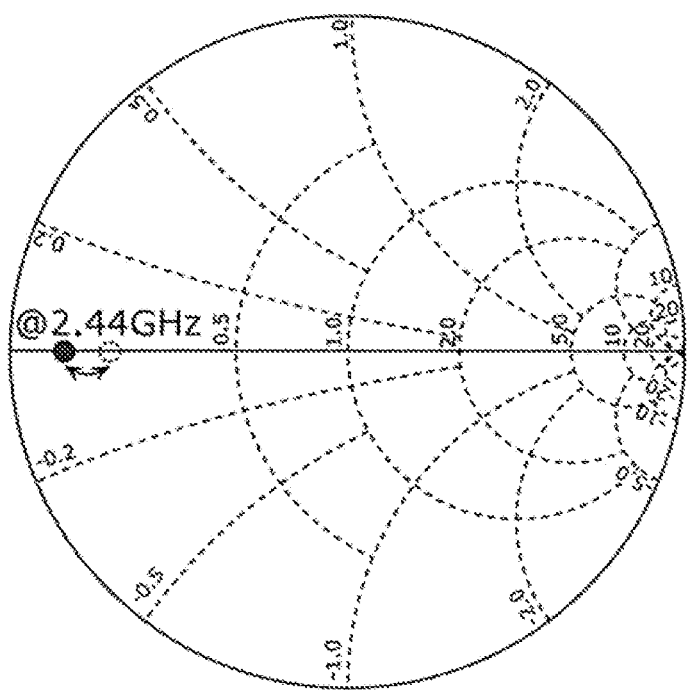
FIG. 5B is a Smith chart illustrating the output load impedance of a power amplifier in the case in which a transmit signal of Wi-Fi is transmitted in the high frequency circuit according to the second embodiment.

FIG. 5B is a Smith chart illustrating the output load impedance of the power amplifier 11 in the case in which a transmit signal of Wi-Fi is transmitted in the high frequency circuit 1A according to the second embodiment. As illustrated in the drawing, the output load impedance of the power amplifier 11 at an almost center frequency (2.44 GHz) in the frequency band used in Wi-Fi (the impedance at 2.44 GHz when a transmit and receive terminal 141 side is viewed from the terminal 121, a black circle in FIG. 5B) is located almost on a real axis on a low impedance side.

In the case in which the high frequency circuit 1A is in the Bluetooth mode, as illustrated in FIG. 6A, the switch 13 is changed to a connected state (ON) and the common terminal 15a and the selection terminal 15b of the switch 15 are changed to a connected state (ON). As a result, the matching circuits 24 and 25 are added to a transmit path connecting the power amplifier 11 and the transmit and receive terminal 141.

Figure 6B:
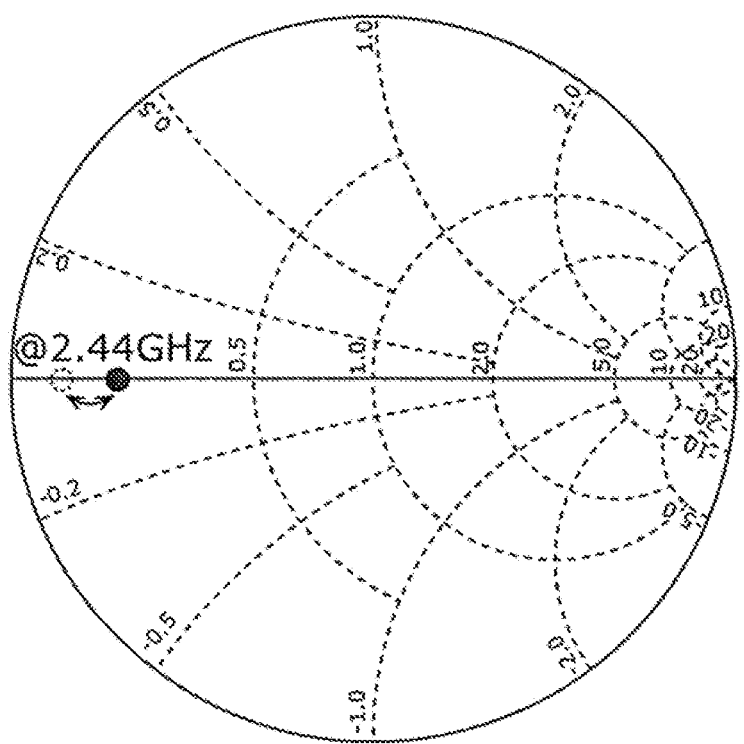
FIG. 6B is a Smith chart illustrating the output load impedance of the power amplifier in the case in which a transmit signal of Bluetooth is transmitted in the high frequency circuit according to the second embodiment.

FIG. 6B is a Smith chart illustrating the output load impedance of the power amplifier 11 in the case in which a transmit signal of Bluetooth is transmitted in the high frequency circuit 1A according to the second embodiment. As illustrated in the drawing, the output load impedance of the power amplifier 11 at an almost center frequency (2.44 GHz) in the frequency band used in Bluetooth (the impedance at 2.44 GHz when a transmit and receive terminal 141 side is viewed from the terminal 121, a black circle in FIG. 6B) is located almost on a real axis and shifted to a higher impedance side than the output load impedance of the power amplifier 11 in the Wi-Fi mode.

In the Wi-Fi mode, since the switch 13 is in a disconnected state (OFF), the inductors 63 and 64 positioned outside the semiconductor IC 10A do not affect the output load impedance of the power amplifier 11. The output load impedance of the power amplifier 11 in the Wi-Fi mode is adjusted by using only the matching circuit 24 out of the matching circuits 24 and 25. By contrast, in the Bluetooth mode, the switch 13 is in a connected state (ON) and the common terminal 15a and the selection terminal 15b of the switch 15 are in a connected state (ON), and thus, the inductors 63 and 64 are in connection with the transmit path. As a result, the output load impedance of the power amplifier 11 in the Bluetooth mode is adjusted by using both the matching circuits 24 and 25 and moved to lower impedance side in comparison to the case of the Wi-Fi mode.

With the circuit configuration described above, by performing switching of the switches 13 and 15, the output load impedance of the power amplifier 11 can be set at an optimum value in the Wi-Fi mode and an optimum value in the Bluetooth mode. Furthermore, since the power amplifier 11, the low-noise amplifier 12, and the switches 13 and 15 are formed into a single chip of the semiconductor IC 10A, the high frequency circuit 1 can be downsized. Moreover, since the passive elements (the inductor 61 and the capacitor 62) of the matching circuit 24 and the passive elements (the inductors 63 and 64) of the matching circuit 25, which greatly affect the output load impedance value of the power amplifier 11, are positioned outside the semiconductor IC 10A, these passive elements can be, for example, replaced with other kinds of elements in accordance with a communication mode to which the high frequency circuit 1 is applied and high flexibility to adjust the circuit constant can be thus achieved. As a result, it is possible to provide the high frequency circuit 1A in a small size and the communication device 5A in a small size that can highly accurately establish impedance matching with respect to two kinds of communication modes, such as Wi-Fi and Bluetooth in adjacent different frequency bands.

A specific circuit configuration of the matching circuit 24 and a specific circuit configuration of the matching circuit 25 are not limited to the circuit configuration described above. For example, replacing at least either the inductor 63 or 64 of the matching circuit 25 with a capacitor enables reversing high and low of the output load impedance of the power amplifier 11. In this case, by changing the switch 13 to a connected state (ON) and changing the common terminal 15a and the selection terminal 15b to a connected state (ON), it is possible to locate the output load impedance of the power amplifier 11 almost on a real axis on a low impedance side. Alternatively, by changing the switch 13 to a disconnected state (OFF) and changing the common terminal 15a and the selection terminal 15c to a connected state (ON), it is possible to locate the output load impedance of the power amplifier 11 on a relatively high impedance side. Thus, in this case, the switch 13 is changed to a disconnected state (OFF) in the Bluetooth mode and the switch 13 is changed to a connected state (ON) in the Wi-Fi mode. This means that Wi-Fi may be used as the first communication mode and Bluetooth may be used as the second communication mode.

Figure 7:
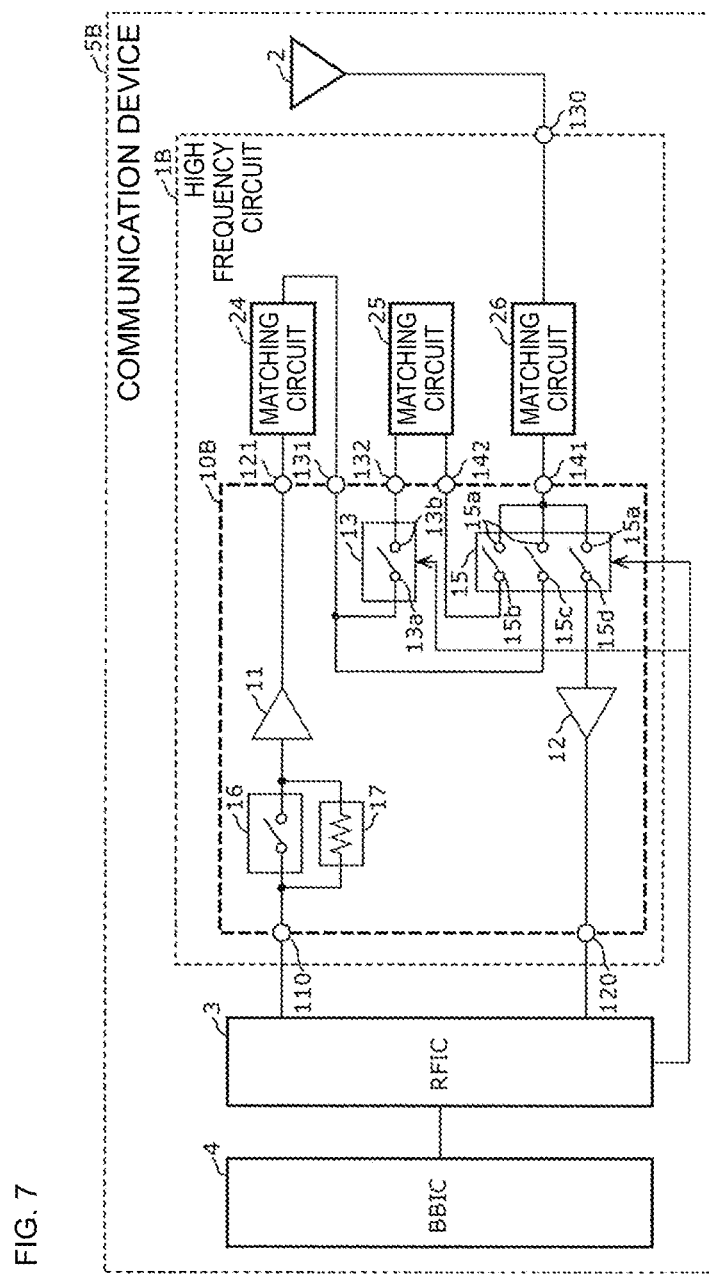
FIG. 7 is a circuit block diagram of a high frequency circuit and a communication device according to a modified example of the second embodiment.

2.3 High Frequency Circuit 1B and Communication Device 5B According to Modified Example FIG. 7 is a circuit block diagram of a high frequency circuit 1B and a communication device 5B according to a modified example of the second embodiment. As illustrated in the drawing, the communication device 5B includes the high frequency circuit 1B, the antenna 2, the RFIC 3, and the BBIC 4. The communication device 5B according to the modified example differs from the communication device 5A according to the second embodiment in a circuit configuration of the high frequency circuit 1B. Hereinafter, the communication device 5B according to the modified example is described while the description mainly focuses on the configuration of the high frequency circuit 1B.

The high frequency circuit 1B includes the power amplifier 11, the low-noise amplifier 12, the switches 13 and 15 and a switch 16, an attenuator 17, the transmit and receive terminal 141, the transmit terminal 110, the receive terminal 120, the external connection terminal 130, the terminals 121, 131, 132, and 142, and the matching circuits 24, 25, and 26. The high frequency circuit 1B according to the modified example differs from the high frequency circuit 1A according to the second embodiment in that the switch 16 and the attenuator 17 are additionally included. Hereinafter, concerning the high frequency circuit 1B according to the modified example, description of configurations identical to the configurations of the high frequency circuit 1A according to the second embodiment is omitted and different configurations are mainly described.

The attenuator 17 is coupled between the transmit terminal 110 and the power amplifier 11. The switch 16 is coupled in parallel with the attenuator 17. With this configuration, in the case in which the switch 16 is in a disconnected state, a high frequency signal inputted from the transmit terminal 110 is inputted to the power amplifier 11 after the high frequency signal passes through the attenuator 17. By contrast, in the case in which the switch 16 is in a connected state, the high frequency signal is inputted directly to the power amplifier 11 without necessarily passing through the attenuator 17. This means a circuit in which the attenuator 17 and the switch 16 are coupled in parallel with each other forms a variable attenuation circuit that varies attenuation of a high frequency signal by changing the switch 16 between a connected state and a disconnected state. The variable attenuation circuit positioned between the transmit terminal 110 and the power amplifier 11 is not necessarily formed by the parallel circuit consisting of the attenuator 17 and the switch 16 and may be formed of a variable attenuation element that varies attenuation (a resistance value). Alternatively, instead of the variable attenuation circuit, the power amplifier 11 per se may vary gain.

A required output power value of a high frequency signal outputted from the power amplifier 11 differs between the Wi-Fi mode and the Bluetooth mode.

In the configuration described above, by changing the output load impedance of the power amplifier 11 between the Wi-Fi mode and the Bluetooth mode and also changing the switch 16 between a connected state and a disconnected state, the output power value of the power amplifier 11 can be changed between the Wi-Fi mode and the Bluetooth mode.

Together with the power amplifier 11, the low-noise amplifier 12, the switches 13 and 15, the transmit and receive terminal 141, the transmit terminal 110, the receive terminal 120, and the terminals 121, 131, 132, and 142, the attenuator 17 and the switch 16 may be formed at a semiconductor IC 10B.

2.4 Effects

As described above, in the present embodiment, the high frequency circuit 1A includes the transmit terminal 110 and the transmit and receive terminal 141, the power amplifier 11 that amplifies a high frequency signal inputted from the transmit terminal 110 and outputs the high frequency signal toward the transmit and receive terminal 141, and the output matching circuit that is positioned on the signal path connecting the power amplifier 11 and the transmit and receive terminal 141 and that optimizes the output load impedance of the power amplifier 11. The output matching circuit is coupled to the output terminal of the power amplifier 11 and includes the matching circuit 24 having the first passive element, the matching circuit 25 having the second passive element, and the switch 13 that switches between a connected state and a disconnected state of the matching circuits 24 and 25. The power amplifier 11 and the switch 13 are formed at the single semiconductor IC 10. The first passive element and the second passive element are formed outside the semiconductor IC 10.

With this configuration, it is possible to provide the high frequency circuit 1A in a small size that can highly accurately establish impedance matching by changing the optimum value of the output load impedance of the power amplifier 11 with respect to two kinds of high frequency signals in adjacent or overlapping different frequency bands.

Furthermore, in the present embodiment, in the case in which a high frequency signal of the first communication mode is transmitted from the transmit and receive terminal 141, the switch 13 may connect the matching circuits 24 and 25; in the case in which a high frequency signal of the second communication mode is transmitted from the transmit and receive terminal 141, the switch 13 may disconnect the matching circuits 24 and 25.

With this configuration, performing switching of the switch 13 enables setting two kinds of optimum values of output load impedance of the power amplifier 11. As a result, it is possible to provide the high frequency circuit 1A in a small size.

Moreover, in the present embodiment, the high frequency circuit 1A may further include the switch 15 (the common terminal 15a, and the selection terminals 15b and 15c) that changes a connection between the transmit and receive terminal 141 and the matching circuit 24 and a connection between the transmit and receive terminal 141 and the matching circuit 25. The switch 15 may be formed at the semiconductor IC 10.

With this configuration, it is possible to provide the multimode high frequency circuit 1A in a small size that can easily adjust impedance.

Furthermore, in the present embodiment, in the case in which a high frequency signal of the first communication mode is transmitted from the transmit and receive terminal 141, the switch 15 may connect the matching circuit 25 and the transmit and receive terminal 141; in the case in which a high frequency signal of the second communication mode is transmitted from the transmit and receive terminal 141, the switch 15 may connect the matching circuit 24 and the transmit and receive terminal 141.

With this configuration, performing switching of the switch 15 enables setting two kinds of optimum values of output load impedance of the power amplifier 11. As a result, it is possible to provide the high frequency circuit 1A in a small size.

Moreover, in the present embodiment, the first communication mode may be Bluetooth and the second communication mode may be Wi-Fi.

With this configuration, in response to switching between the Bluetooth mode, an important performance parameter of which is ACP, and the Wi-Fi mode, an important performance parameter of which is EVM, it is possible to change the output load impedance value of the power amplifier 11.

Further, in the present embodiment, the high frequency circuit 1A further includes the receive terminal 120, the low-noise amplifier 12 that is coupled to the receive terminal 120 and that amplifies a high frequency signal inputted from the transmit and receive terminal 141 and outputs the high frequency signal to the receive terminal 120, and the switch 15 (the common terminal 15a and the selection terminal 15d) that switches between a connected state and a disconnected state of the transmit and receive terminal 141 and the low-noise amplifier 12. The low-noise amplifier 12 and the switch 15 may be formed at the semiconductor IC 10.

With this configuration, switching between transmission and reception can be performed together with optimum impedance adjustment.

Further, in the present embodiment, the high frequency circuit 1A may include the multiple-pole multiple-throw switch 15 having the common terminal 15a, and the selection terminal 15b, 15c, and 15d. The common terminal 15a may be coupled to the transmit and receive terminal 141. The selection terminal 15c may be coupled to the matching circuit 24. The selection terminal 15b may be coupled to the matching circuit 25. The selection terminal 15d may be coupled to the input terminal of the low-noise amplifier 12. The low-noise amplifier 12 and the switch 15 may be formed at the semiconductor IC 10. The switch 15 may change a connection between the transmit and receive terminal 141 and the matching circuit 24, a connection between the transmit and receive terminal 141 and the matching circuit 25, and a connection between the transmit and receive terminal 141 and the low-noise amplifier 12.

With this configuration, the switch 15 can be used as both a switch that changes a connection between the matching circuits 24 and 25 on the transmit path involving the power amplifier 11 and a transmission and reception switch that changes the receive path involving the low-noise amplifier 12 and the transmit path. This means that a function of changing matching on a transmit path is added to the transmission and reception switch formed at the semiconductor IC 10, and as a result, an individual switch for changing matching can be excluded. Therefore, it is possible to provide the multimode high frequency circuit 1A in a relatively small size that can easily adjust impedance and change between transmission and reception.

Furthermore, in the modified example of the present embodiment, the high frequency circuit 1B may include the variable attenuation circuit (the switch 16 and the attenuator 17) coupled between the transmit terminal 110 and the power amplifier 11.

With this configuration, it is possible to change the output load impedance of the power amplifier 11 between different communication modes and also change the output power value of the power amplifier 11.

Moreover, in the modified example of the present embodiment, the variable attenuation circuit may be formed at the semiconductor IC 10.

With this configuration, it is possible to provide the multimode high frequency circuit 1B in a small size that can easily adjust impedance.

Furthermore, in the present embodiment, the high frequency circuit 1A may further include the filter 41 positioned between the matching circuit 24 and the transmit and receive terminal 141.

With this configuration, it is possible to reduce noise in a high frequency signal outputted from the power amplifier 11 and the filter 41 can be used as an impedance matching circuit provided between the power amplifier 11 and the transmit and receive terminal 141.

Furthermore, in the present embodiment, the high frequency circuit 1A may further include the external connection terminal 130 and the matching circuit 26 coupled between the transmit and receive terminal 141 and the external connection terminal 130.

With this configuration, it is possible to adjust impedance matching between the high frequency circuit 1A and an external circuit coupled to the external connection terminal 130.

Moreover, in the present embodiment, the communication device 5A includes the RFIC 3 that processes a high frequency signal received or to be transmitted by the antenna 2 and the high frequency circuit 1A that communicates the high frequency signal between the antenna 2 and the RFIC 3.

With this configuration, it is possible to provide the communication device 5A in a small size that can highly accurately establish impedance matching by changing the optimum value of the output load impedance of the power amplifier 11 with respect to two kinds of high frequency signals in adjacent or overlapping different frequency bands.

Other Embodiments

While the high frequency circuit and the communication device according to the first and second embodiments have been described above by using the embodiments and the modified example, the high frequency circuit and the communication device of the present disclosure are not limited to the embodiments and the modified example. The present disclosure also embraces other embodiments implemented as any combination of the constituent elements of the embodiments and the modified example, other modified examples obtained by making various modifications that occur to those skilled in the art without necessarily departing from the scope of the embodiments and the modified example described above, and various hardware devices including the high frequency circuit and the communication device of the embodiments and the modified example.

For example, the variable attenuation circuit (the switch 16 and the attenuator 17) according to the modified example of the second embodiment may be positioned between the transmit terminal 110 and the power amplifier 11 of the high frequency circuit 1 according to the first embodiment.

Further, for example, in the high frequency circuit and the communication device according to the embodiments and the modified example described above, another circuit element or another wire may be inserted between the circuit elements or the paths connecting a signal path that are illustrated in the drawings.

Furthermore, the semiconductor IC 10 according to the present disclosure may be implemented by large scale integration (LSI) as an integrated circuit. The method of fabricating the integrated circuit may be to implement the integrated circuit by using a dedicated circuit or a general processor. It is possible to use a field-programmable gate array (FPGA) that is programmable after the LSI device is manufactured or a reconfigurable processor in which the connection or the setting of a circuit cell inside the LSI device can reconfigurable after the LSI device is manufactured. Furthermore, if LSI is replaced with another technology of fabricating an integrated circuit developed due to progress of semiconductor technologies or other technologies derived from LSI, it is not surprising to use the technology for integrating functional blocks with each other.

The present disclosure can be used widely in communication devices, such as a mobile phone, as a high frequency front-end circuit required to be downsized.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A high frequency circuit comprising:
   a first terminal and a second terminal;
   a first amplifier that amplifies a high frequency signal inputted from the first terminal and outputs the high frequency signal toward the second terminal; and
   an output matching circuit that is positioned on a signal path connecting the first amplifier and the second terminal, the output matching circuit optimizing output load impedance of the first amplifier, wherein:
   the output matching circuit includes
      a first common matching circuit that is coupled to an output terminal of the first amplifier, the first common matching circuit having a first passive element,
      a selective matching circuit that has a second passive element, and
      a first switching circuit that switches between a connected state and a disconnected state of the first common matching circuit and the selective matching circuit,
   the first amplifier and the first switching circuit are formed on a single semiconductor integrated circuit, and
   the first passive element and the second passive element are formed outside the semiconductor integrated circuit.

2. The high frequency circuit according to claim 1, wherein
   when a high frequency signal of a first communication mode is transmitted from the second terminal, the first switching circuit connects the first common matching circuit and the selective matching circuit, and
   when a high frequency signal of a second communication mode is transmitted from the second terminal, the first switching circuit disconnects the first common matching circuit and the selective matching circuit.

3. The high frequency circuit according to claim 1, further comprising:
   a second switching circuit that changes a first connection between the second terminal and the first common matching circuit and a second connection between the second terminal and the selective matching circuit, wherein
   the second switching circuit is formed on the semiconductor integrated circuit.

4. The high frequency circuit according to claim 2, further comprising:
   a second switching circuit that changes a first connection between the second terminal and the first common matching circuit and a second connection between the second terminal and the selective matching circuit, wherein
   the second switching circuit is formed on the semiconductor integrated circuit.

5. The high frequency circuit according to claim 3, wherein
   when a high frequency signal of a first communication mode is transmitted from the second terminal, the second switching circuit connects the selective matching circuit and the second terminal, and
   when a high frequency signal of a second communication mode is transmitted from the second terminal, the second switching circuit connects the first common matching circuit and the second terminal.

6. The high frequency circuit according to claim 2, wherein
   the first communication mode is one of Bluetooth® or Wi-Fi® and,
   the second communication mode is another one of Bluetooth or Wi-Fi.

7. The high frequency circuit according to claim 5, wherein
   the first communication mode is one of Bluetooth® or Wi-Fi® and,
   the second communication mode is another one of Bluetooth or Wi-Fi.

8. The high frequency circuit according to claim 1, further comprising:
   a third terminal;
   a second amplifier that is coupled to the third terminal and that amplifies a high frequency signal inputted from the second terminal and outputs the high frequency signal to the third terminal; and
   a third switching circuit that switches between a connected state and a disconnected state of the second terminal and the second amplifier, wherein
   the second amplifier and the third switching circuit are formed on the semiconductor integrated circuit.

9. The high frequency circuit according to claim 2, further comprising:
   a third terminal;
   a second amplifier that is coupled to the third terminal and that amplifies a high frequency signal inputted from the second terminal and outputs the high frequency signal to the third terminal; and a third switching circuit that switches between a connected state and a disconnected state of the second terminal and the second amplifier, wherein the second amplifier and the third switching circuit are formed on the semiconductor integrated circuit.

10. The high frequency circuit according to claim 1, further comprising:

a third terminal;

a second amplifier that is coupled to the third terminal and that amplifies a high frequency signal inputted from the second terminal and outputs the high frequency signal to the third terminal; and a fourth switching circuit that is of a multiple-pole multiple-throw type and that includes a common terminal, a first selection terminal, a second selection terminal, and a third selection terminal, wherein:

the common terminal is coupled to the second terminal, the first selection terminal is coupled to the first common matching circuit, the second selection terminal is coupled to the selective matching circuit, the third selection terminal is coupled to an input terminal of the second amplifier, the second amplifier and the fourth switching circuit are formed on the semiconductor integrated circuit, and the fourth switching circuit changes a first connection between the second terminal and the first common matching circuit, a second connection between the second terminal and the selective matching circuit, and a third connection between the second terminal and the second amplifier.

11. The high frequency circuit according to claim 1, further comprising:

a variable attenuation circuit that is coupled between the first terminal and the first amplifier.

12. The high frequency circuit according to claim 2, further comprising:

a variable attenuation circuit that is coupled between the first terminal and the first amplifier.

13. The high frequency circuit according to claim 11, wherein the variable attenuation circuit is formed on the semiconductor integrated circuit.

14. The high frequency circuit according to claim 1, further comprising:

a filter that is positioned between the first common matching circuit and the second terminal.

15. The high frequency circuit according to claim 2, further comprising:

a filter that is positioned between the first common matching circuit and the second terminal.

16. The high frequency circuit according to claim 1, further comprising:

an external connection terminal; and a second common matching circuit that is coupled between the second terminal and the external connection terminal.

17. The high frequency circuit according to claim 2, further comprising:

an external connection terminal; and a second common matching circuit that is coupled between the second terminal and the external connection terminal.

18. A communication device comprising:

an RF signal processing circuit that processes a high frequency signal received or transmitted by an antenna; and the high frequency circuit according to claim 1 that communicates the high frequency signal between the antenna and the RF signal processing circuit.

19. A communication device comprising:

an RF signal processing circuit that processes a high frequency signal received or transmitted by an antenna; and the high frequency circuit according to claim 2 that communicates the high frequency signal between the antenna and the RF signal processing circuit.

20. A communication device comprising:

an RF signal processing circuit that processes a high frequency signal received or transmitted by an antenna; and the high frequency circuit according to claim 8 that communicates the high frequency signal between the antenna and the RF signal processing circuit.

* * * * *